(12) United States Patent
Ooi et al.

(10) Patent No.: US 6,724,080 B1
(45) Date of Patent: Apr. 20, 2004

(54) HEAT SINK WITH ELEVATED HEAT SPREADER LID

(75) Inventors: Wee Kok Ooi, Sungai Dua (MY); Lim Ken Beng, Bayan Lepas (MY)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/327,242

(22) Filed: Dec. 20, 2002

(51) Int. Cl.[7] .................. H01L 23/367; H01L 23/373
(52) U.S. Cl. .................. 257/704; 257/707; 361/719
(58) Field of Search ................. 257/675, 704, 257/706, 707, 712, 713, 720, 778; 361/688, 704, 717, 718, 719

(56) References Cited

U.S. PATENT DOCUMENTS

| | | | |
|---|---|---|---|
| 5,909,056 A | * | 6/1999 | Mertol ............... 257/704 |
| 6,011,304 A | * | 1/2000 | Mertol ............... 257/706 |
| 6,285,553 B1 | * | 9/2001 | Suyama et al. ......... 361/719 |
| 6,552,264 B2 | * | 4/2003 | Carden et al. ......... 174/52.4 |
| 2003/0067746 A1 | * | 4/2003 | Ishimine ............ 361/690 |

* cited by examiner

Primary Examiner—John B. Vigushin
(74) Attorney, Agent, or Firm—Beyer Weaver & Thomas LLP

(57) ABSTRACT

Provided is a heat sink designed to constrain warpage during thermal cycling. The heat sink is composed of a picture frame stiffener and a heat spreader lid. The stiffener has a thickness greater than that of the height of a die bonded on a substrate in the package which the heat sink is or is to be used. The increased thickness of the stiffener beyond conventional designs serves to increase its stiffness and thereby enhance its capacity to constrain the substrate to prevent its warpage during thermal cycling. The thickened stiffener is coupled with an elevated heat spreader lid, that is, a heat spreader lid with a elevated central portion configured for engagement with the picture frame stiffener such that a central portion of at least one side of the heat spreader lid extends into the opening in the picture frame stiffener. As a result, the heat spreader lid is in a position to constrain warpage of the package by applying a counter force against a warping die.

26 Claims, 4 Drawing Sheets

HEAT SINK WITH ELEVATED HEAT SPREADER LID

BACKGROUND OF THE INVENTION

This invention relates generally to semiconductor chip device assembly, and in particular to flip chip device assembly. More specifically, the invention relates to a heat sink having an elevated heat spreader lid for a semiconductor package and an assembly process for such a package.

In semiconductor device assembly, a semiconductor chip (also referred to as an integrated circuit (IC) chip or "die") may be bonded directly to a packaging substrate, without the need for a separate leadframe or for separate I/O connectors (e.g., wire or tape). Such chips are formed with ball-shaped beads or bumps of solder affixed to their I/O bonding pads. During packaging, the chip is "flipped" onto its active circuit surface so that the solder balls form electrical connections directly between the chip and conductive traces on a packaging substrate. Semiconductor chips of this type are commonly called "flip chips."

In a conventional method for packaging a semiconductor flip chip a semiconductor die and a packaging substrate are electrically connected and mechanically bonded in a solder joining operation. For example, an unbonded flip chip may have an array of solder balls or bumps arranged on its active circuit surface. The solder is generally composed of a low melting point eutectic material or a high lead material, for example.

The die is aligned with and placed onto a placement site on the packaging substrate such that the die's solder balls are aligned with electrical traces on the substrate. The substrate is typically composed of a laminate or organic material. Heat is applied to one or more of the die and the packaging substrate, causing the solder balls to reflow and form electrical connections between the die and the packaging substrate. The package is then cooled to harden the connection. An underfill material is also generally applied in order to enhance the mechanical bonding of the die and substrate. In this manner the process produces an electrically and mechanically bonded semiconductor chip assembly, with the underfill material allowing a redistribution of the stress at the connection between the die and the substrate from the solder joints only to the entire sub-die area.

Semiconductor packages are typically subject to temperature cycling during normal operation. In order to improve the thermal performance and reliability of the packages, heat sinks are commonly used. Semiconductor heat sinks typically have stiffener and heat spreader lid components.

A picture frame stiffener is typically placed around the die on the substrate where it is bonded with a heat curable adhesive. The stiffener is typically a flat piece of high modulus metal having substantially the same dimensions as the package substrate with an opening in its center to clear the die. The thickness of the stiffener is typically about the same or slightly more than the height of the die bonded on the substrate. Typically, the stiffener is composed of a copper-based material, e.g., (nickel-plated copper) which has a coefficient of thermal expansion similar to that of typical substrate materials. The purpose of the stiffener is to constrain the substrate in order to prevent its warpage or other movement relative to the die which may be caused by thermal cycling during operation of an electronic device in which the package is installed. Such movement may result from the different coefficients of thermal expansion (CTEs) of the die and substrate materials, and may produce stress in the die or the package as a whole which can result in electrical and mechanical failures.

A heat spreader lid, typically composed of a high thermal conductivity material, and having substantially the same dimensions as the package substrate, is attached over the picture frame stiffener and the die. A conventional heat spreader is typically a flat piece of copper-based material, e.g., (nickel-plated copper). The heat spreader is bonded to the stiffener by a thermally conductive adhesive which is also then heat cured. The heat spreader typically connects with the inactive (non-substrate bound) surface of the die via a thermal grease or adhesive. The purpose of the heat spreader is to disperse the heat generated during thermal cycling in order to reduce stress in the package due to different CTEs of the various elements of the package, including the die, substrate and underfill.

A problem with such flip chip package constructions is that during thermal cycling, the whole package is highly stressed due to the different coefficients of thermal expansion (CTEs) of the substrate and die materials. Shrinkage of the substrate, typically having a CTE of about 17 ppm, is much more than that of the die, which typically has a CTE of about 4 ppm. The high stress experienced by these bonded materials during cooling may cause them to warp delaminate or crack. Such stress in the semiconductor package may ultimately result in its electronic and/or mechanical failure, including cracking of the die, substrate or their solder electrical connections. This problem is particularly acute for larger die sizes, for example dies having dimensions at or in excess of 20 mm on a side, which are presently being fabricated and packaged.

Accordingly, what is needed are apparatuses and methods for improving the reliability of flip-chip packages by constraining warpage during thermal cycling, particularly for large die size packages.

SUMMARY OF THE INVENTION

To achieve the foregoing, the present invention provides a heat sink designed to constrain warpage during thermal cycling. The heat sink is composed of a picture frame stiffener and a heat spreader lid. The stiffener has a thickness greater than that of the height of a die bonded on a substrate in the package which the heat sink is or is to be used. The increased thickness of the stiffener beyond conventional designs serves to increase its stiffness and thereby enhance its capacity to constrain the substrate to prevent its warpage during thermal cycling. The thickened stiffener is coupled with an elevated heat spreader lid, that is, a heat spreader lid with a elevated central portion configured for engagement with the picture frame stiffener such that a central portion of at least one side of the heat spreader lid extends into the opening in the picture frame stiffener. The elevated portion of the heat spreader lid extends sufficiently into the central opening in the stiffener to make contact with the inactive (non-substrate bound) side of the die in the package which the heat sink is in or is to be used. Thermal grease is generally used at the joint of the heat spreader lid and the die. As a result, the heat spreader lid is in a position to constrain warpage of the package by applying a counter force against a warping die.

In one aspect, the invention pertains to a semiconductor package heat sink. The heat sink includes a picture frame stiffener having a central opening, and a heat spreader lid configured for engagement with the picture frame stiffener such that a central portion of at least one side of the heat spreader lid extends into the opening in the picture frame stiffener.

In another aspect, the invention pertains to a semiconductor package. The package includes a packaging substrate, a picture frame stiffener having a central opening bonded on a die side of the substrate, a semiconductor die bonded on its active side within the central opening on the die side of the substrate, and a heat spreader lid engaged with the picture frame stiffener such that a central portion of at least one side of the heat spreader lid extends into the opening in the picture frame stiffener and engages the back side of the die.

In another aspect, the invention pertains to a method of packaging a semiconductor die. The method involves bonding the die to a substrate, bonding a picture frame stiffener having a central opening around the die on the substrate, and bonding a heat spreader lid to the stiffener. The heat spreader lid configured such that a central portion of at least one side of the heat spreader lid extends into the opening in the picture frame stiffener and engages the die.

These and other features and advantages of the present invention are described the detailed description which follows.

DETAILED DESCRIPTION OF SPECIFIC EMBODIMENTS

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

When used in combination with "comprising," "a method comprising," "a device comprising" or similar language in this specification and the appended claims, the singular forms "a," "an," and "the" include plural reference unless the context clearly dictates otherwise. Unless defined otherwise, all technical and scientific terms used herein have the same meaning as commonly understood to one of ordinary skill in the art to which this invention belongs.

The present invention provides a heat sink designed to constrain warpage during thermal cycling. The heat sink is composed of a picture frame stiffener and a heat spreader lid. The stiffener has a thickness greater than that of the height of a die bonded on a substrate in the package which the heat sink is or is to be used. The increased thickness of the stiffener beyond conventional designs serves to increase its stiffness and thereby enhance its capacity to constrain the substrate to prevent its warpage during thermal cycling. The thickened stiffener is coupled with an elevated heat spreader lid, that is, a heat spreader lid with an elevated central portion configured for engagement with the picture frame stiffener such that a central portion of at least one side of the heat spreader lid extends into the opening in the picture frame stiffener. Preferably, the elevated portion of the heat spreader lid will extend sufficiently into the central opening in the stiffener to make contact with the inactive (non-substrate bound) side of the die in the package which the heat sink is in or is to be used. As a result, the heat spreader lid is in a position to constrain warpage of the package by applying a counter force against a warping die.

Figure 1A:
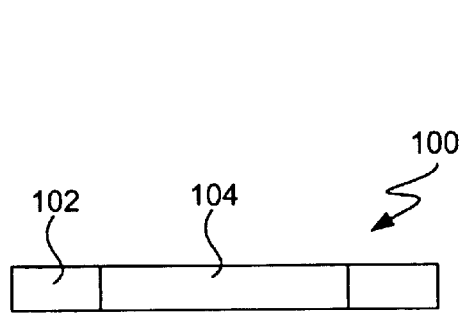
FIG. 1A shows a cross-sectional view of a picture frame stiffener for incorporation in a heat sink in accordance with the present invention.
Figure 1B:
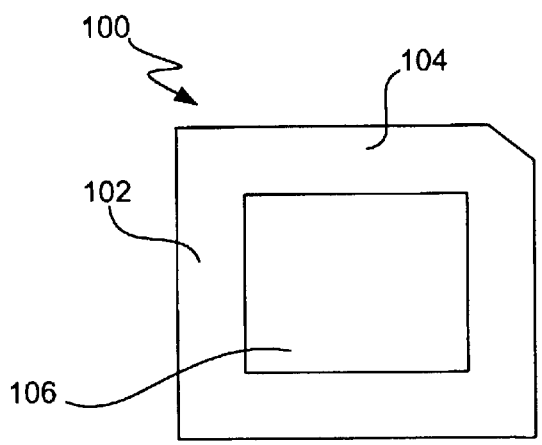
FIG. 1B shows a front plan view of the picture frame stiffener of FIG. 1A.

FIGS. 1A and 1B show cross-sectional and front plan views, respectively, of a picture frame stiffener for incorporation in a heat sink in accordance with the present invention. The stiffener 100 may be composed of any high modulus (preferably about $9 \times 10^6$ to $30 \times 10^6$ psi; more preferably about $15 \times 10^6$ to $30 \times 10^6$ psi, and most preferably about $25 \times 10^6$ psi) material compatible with the manufacture and operation of semiconductor packaging. In a preferred embodiment, the stiffener 100 is composed of a high modulus metal which provides the benefit of rigidity to prevent warpage. Copper is a preferred material for its properties and cost. A particularly preferred material is nickel-plated copper.

The picture frame stiffener 100 has a perimeter region 102, 104 and a central opening 106. For a preferred copper stiffener, the thickness (of the perimeter region) may be in the range of about 0.6 to 1 mm. The thickness used may vary based on the thickness of the die. In one embodiment, for a heat sink suitable for use with a 19 mil thick die, a particularly preferred thickness is 0.8 mm. The increased thickness of the stiffener beyond conventional designs serves to increase its stiffness and thereby enhance its capacity to constrain the substrate to prevent its warpage (due to CTE mismatch) during thermal cycling.

Figure 2A:
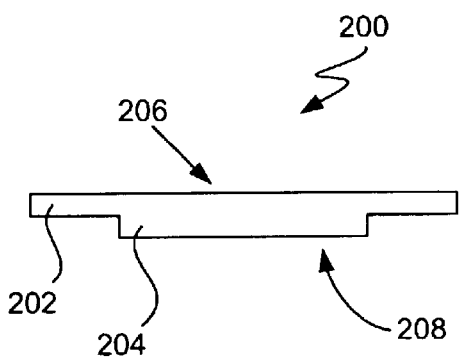
FIG. 2A shows a cross-sectional view of an elevated heat spreader lid for incorporation in a heat sink in accordance with the present invention.
Figure 2B:
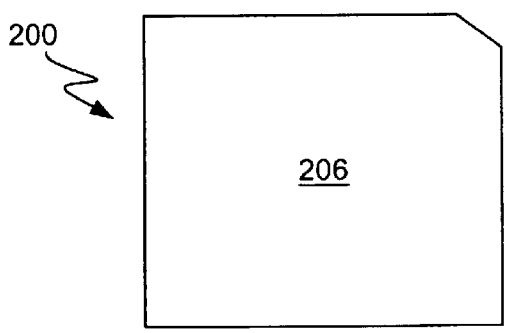
FIG. 2B shows a back plan view of the heat spreader lid of FIG. 2A.
Figure 2C:
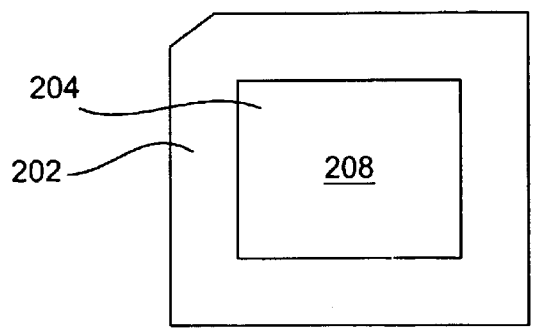
FIG. 2C shows a front plan view of the heat spreader lid of FIG. 2A.

FIGS. 2A, 2B and 2C show cross-sectional, rear plan and front plan views, respectively, of a heat spreader lid for incorporation in a heat sink in accordance with the present invention. The heat spreader lid 200 may be composed of any high modulus (preferably about $9 \times 10^6$ to $30 \times 10^6$ psi; more preferably about $15 \times 10^6$ to $30 \times 10^6$ psi, and most preferably about $25 \times 10^6$ psi), high thermal conductivity (preferably about 2 to 4 W/cm.K; more preferably about 3 to 4 W/cm.K, and most preferably about 4 W/cm.K) material compatible with the manufacture and operation of semiconductor packaging. In a preferred embodiment, the lid 200 is composed of a high modulus, high thermal conductivity metal which provides the benefits of rigidity to prevent warpage and thermal conductivity for heat dissipation. Copper is a preferred material for its properties and cost. A particularly preferred material is nickel-plated copper.

The heat spreader lid 200 has a perimeter region 202 and an elevated central region 204. The lid 200 is configured for engagement with the picture frame stiffener 100 such that the elevated central portion 204 extends into the central opening 106 in the stiffener 100. For a preferred copper heat spreader lid, the thickness of the perimeter region may be in the range of about 0.3 to 1 mm, preferably 0.4 to 0.6 mm, for example 0.5 mm. The (total) thickness of the elevated central region may be in the range of about 0.4 to 1.5 mm, preferably 0.4 to 1 mm, for example 0.8 mm. The thickness used will vary based on the thickness of the die, bump height, adhesive and the stiffener. In one embodiment, for a heat sink suitable for use with a 19 mil thick die and a 0.8 mm thick stiffener, a particularly preferred thickness of the lid perimeter is 0.5 mm and of the elevated central region is 0.8 mm.

The elevated portion of the heat spreader lid will generally extend sufficiently into the central opening in the stiffener to make contact with the inactive (non-substrate bound) side of the die in the package which the heat sink is in or is to be used. As a result, the heat spreader lid is in a position to constrain warpage of the package by applying a counter force against a warping die.

A heat spreader lid suitable for incorporation into a heat sink in accordance with the present invention may have several possible configurations. A preferred lid configuration is depicted in FIGS. 2A–C. This lid 200 has a planar back side 206 with an elevated central region 204 on its front side 208. This configuration has the advantage of a relatively compact size with an adequate mass to facilitate heat dissipation.

Figure 3:
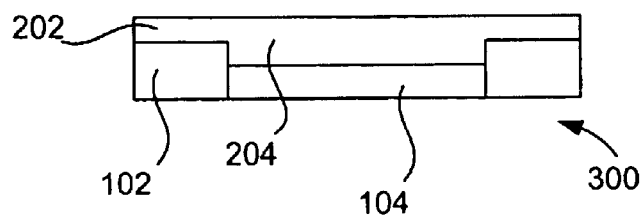
FIG. 3 shows a cross-sectional view of a heat sink in accordance with the present invention.

FIG. 3 depicts one embodiment of a heat sink in accordance with the present invention. The heat sink 300 is composed of the heat spreader lid 200 engaged with the picture frame stiffener 100. The perimeter regions 102, 104 and 202 of the stiffener and heat spreader lid, respectively, are bonded together to form a hard joint using a suitable high modulus, generally thermo-set, adhesive.

Figure 4:
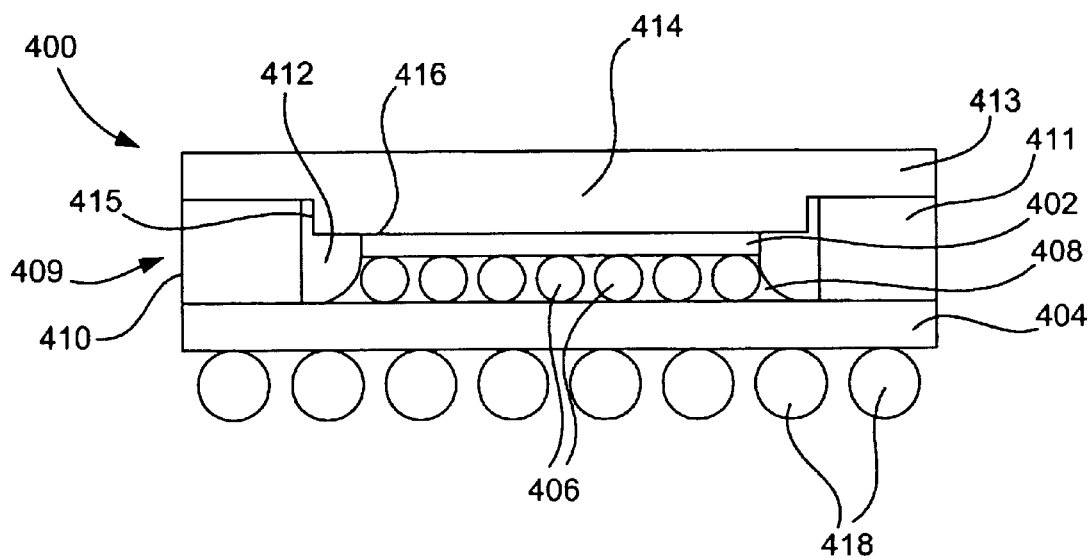
FIG. 4 shows a cross-sectional view of a semiconductor flip chip package incorporating a heat sink in accordance with the present invention.

FIG. 4 shows a cross-sectional view of a semiconductor flip chip package incorporating a heat sink in accordance with one embodiment of the present invention. The package 400 includes a die 402 mechanically and electrically bonded to a substrate 404 by solder bumps 406 and underfill 408. The package further includes a heat sink in accordance with the present invention. The heat sink 409 is composed of a heat spreader lid 414 engaged with the picture frame stiffener 410 such that an elevated portion 415 of the heatspreader lid 414 extends into a central opening 412 in a picture frame stiffener 410 to contact the back side of the die 402. The perimeter regions 411 and 413 of the stiffener and heat spreader lid, respectively, are bonded together to form a hard joint using a suitable high modulus, generally thermo-set, adhesive. The joint 416 between the heat spreader lid 414 and the die 402 is made with thermal grease. The package 400 is prepared for subsequent attachment to a circuit board via a solder ball grid array 418 on the underside of the packaging substrate 404.

Figure 5A:
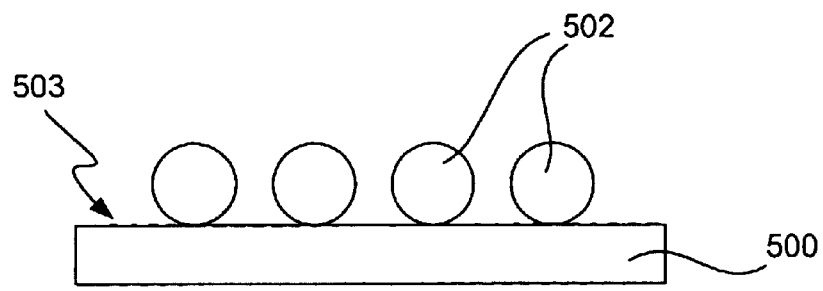
FIGS. 5A–E depict cross-sectional views of stages in the assembly of a flip chip package in accordance with the present invention.

FIGS. 5A–E depict cross-sectional views of stages in the assembly of a flip chip package in accordance with a specific embodiment of the present invention. It should be noted that certain stages of the packaging operation may occur in a different order than is depicted and described. FIG. 5A shows a cross-sectional view of a flip chip die 500 with an array of solder balls 502 on its active surface 503 in preparation for electrical connection to a substrate.

Figure 5B:
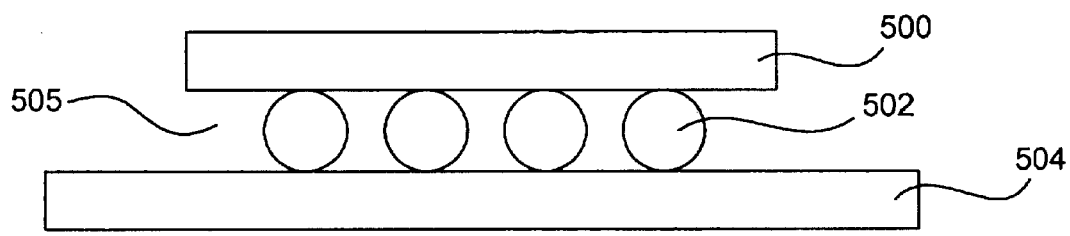

As shown in FIG. 5B, the die is aligned with and placed onto a placement site on the packaging substrate 504 such that the die's solder balls are aligned with electrical traces on the substrate. The substrate 504 is typically composed of a laminate or organic material, such as fiber glass, PTFE (such as Teflon™, available form Gore, Eau Claire, Wis.) BT resin, epoxy laminates or ceramic-plastic composites. Heat (to a temperature of about 240° C., for example) is applied to one or more of the die and the packaging substrate, causing the solder balls to alloy and form electrical connections between the die and the packaging substrate. The package is then cooled to harden the connection.

Figure 5C:
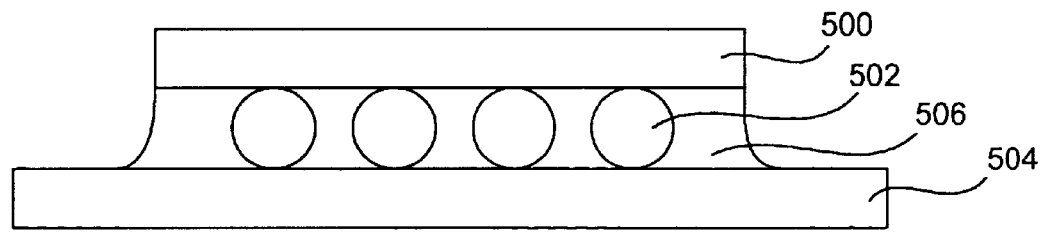

Referring the FIG. 5C, an underfill material 506 is also generally applied in order to enhance the mechanical bonding of the die 500 and substrate 504. An underfill material, typically a thermo-set epoxy, such as is available from Hysol Corporation of Industry, Calif. (e.g., product number 4549), Ablestik Laboratories of Rancho Domingo, Calif., and Johnson Matthey Electronics of San Diego, Calif., is dispensed into the remaining space (or "gap") between the die and the substrate. In a typical procedure, a bead of thermo-set epoxy, is applied along one edge of the die where it is drawn under the die by capillary action until it completely fills the gap between the die and the packaging substrate. Slight heating of the packaging substrate after dispensing of the underfill epoxy may assist the flow. In some cases, the underfill epoxy flow is further assisted by vacuum, or, alternatively, by injection of the epoxy into the gap. Thereafter, the underfill is cured by heating the substrate and die to an appropriate curing temperature for the underfill material, generally in the range of about 150 to 250° C., and then cooled. In this manner the process produces an electrically and mechanically bonded semiconductor chip assembly, with the underfill material allowing a redistribution of the stress at the connection between the die and the substrate from the solder joints only to the entire sub-die area.

Figure 5D:
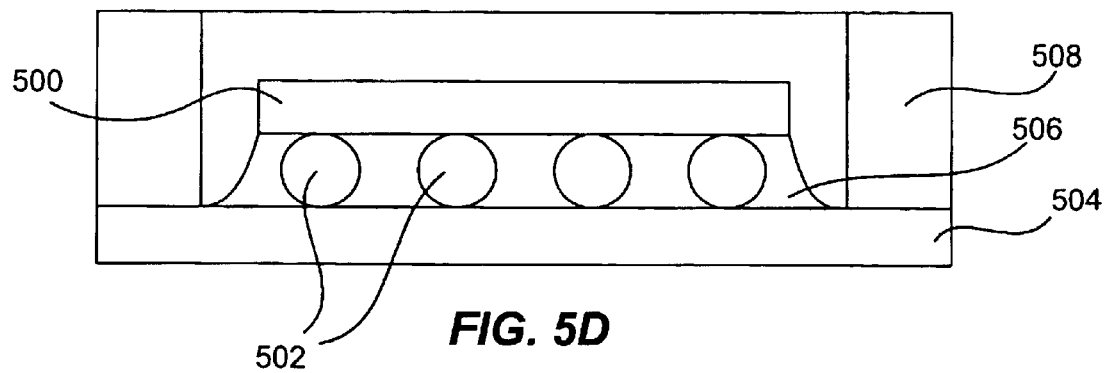

Referring to FIG. 5D, a picture frame stiffener in accordance with the present invention, such as described above, is placed around the die on the substrate where it is bonded with a heat curable adhesive. As noted above, the thickness of the stiffener is selected to be sufficient to constrain the substrate in order to prevent its warpage which may be caused by thermal cycling due to the different coefficients of thermal expansion (CTEs) of the die and substrate materials. In accordance with the present invention, the stiffener has a thickness greater than the height of the die bonded on the substrate. For example, in the case of a 19 mil die, a 0.6–1 mm, preferably 0.8 mm, thick copper stiffener may be used. In some embodiments, the stiffener may alternatively be bonded to the substrate prior to the placement, bonding and underfilling of the die 500.

Figure 5E:
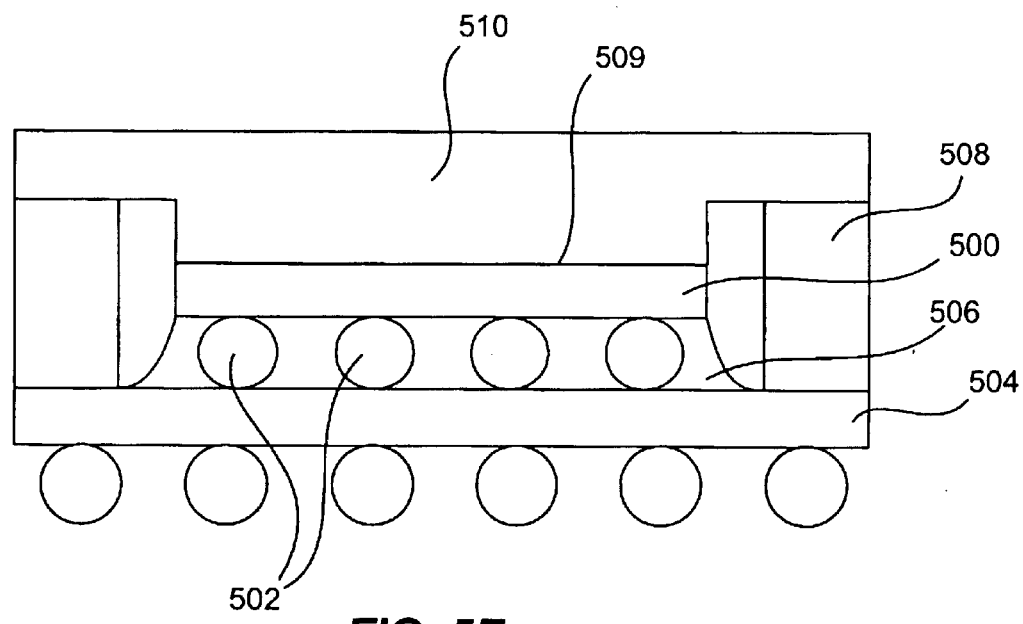

Referring to FIG. 5E, an elevated heat spreader lid 510 in accordance with the present invention, as described above, and having substantially the same dimensions as the package substrate, is engaged with and attached over the picture frame stiffener and the die. The heat spreader is bonded to the stiffener by a thermo-set adhesive. The joint 509 between the heat spreader and the inactive (non-substrate bound) surface of the die is made with a thermal grease or adhesive.

As also shown in FIG. 5E, solder balls 512 are bonded to the underside of the substrate 504. These solder balls 512 may be used to bond the chip package to a circuit board, such as a mother board, for use in an electronic application.

Conclusion

The present invention provides a heat sink designed to constrain warpage during thermal cycling. The heat sink is composed of a picture frame stiffener and a heat spreader lid.

The stiffener has a thickness greater than that of the height of a die bonded on a substrate in the package which the heat sink is or is to be used. The increased thickness of the stiffener beyond conventional designs serves to increase its stiffness and thereby enhance its capacity to constrain the substrate to prevent its warpage during thermal cycling. The thickened stiffener is coupled with an elevated heat spreader lid, that is, a heat spreader lid with a elevated central portion configured for engagement with the picture frame stiffener such that a central portion of at least one side of the heat spreader lid extends into the opening in the picture frame stiffener. The elevated portion of the heat spreader lid extends sufficiently into the central opening in the stiffener to make contact with the inactive (non-substrate bound) side of the die in the package which the heat sink is or is to be used. Since it covers and is in contact (via thermal grease or thermal adhesive) with to the die, the heat spreader also plays a role is constraining the die in place on the substrate.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope and equivalents of the appended claims.

What is claimed is:

1. A semiconductor package heat sink, comprising:
   a picture frame stiffener having a central opening large enough to accommodate a die having at least one edge at least 20 mm in length; and
   a heat spreader lid having a perimeter and a central portion, the lid configured for engagement with the picture frame stiffener such that a central portion of at least one side of the heat spreader lid extends into the opening in the picture frame stiffener, wherein the central portion thickness is about 0.6 to 1 mm and the perimeter thickness is about 0.3 to 0.7 mm.

2. The heat sink of claim 1, wherein the stiffener comprises copper.

3. The heat sink of claim 2, wherein the heat spreader lid comprises copper.

4. The heat sink of claim 3, wherein the stiffener is about 0.6 to 1 mm thick.

5. The heat sink of claim 4, wherein the stiffener is about 0.8 mm thick.

6. The heat sink of claim 5, wherein the central portion of the heat spreader lid extends from about 1–5 mm into the opening in the stiffener.

7. The heat sink of claim 6, wherein the central portion of the heat spreader lid extends about 3 mm into the opening in the stiffener.

8. The heat sink of claim 1, wherein the heat spreader lid has a perimeter thickness that is less than the central portion thickness.

9. The heat sink of claim 8, wherein the side of the heat spreader lid that is opposite the stiffener is substantially planar.

10. The heat sink of claim 1, wherein the central portion thickness is about 0.8 mm and the perimeter thickness is about 0.5 mm.

11. A semiconductor package, comprising:
    a packaging substrate;
    a picture frame stiffener having a central opening bonded on a die side of the substrate;
    a semiconductor die having at least one edge at least 20 mm in length, the die having an active side and a back side, the die bonded on its active side within the central opening on the die side of the substrate; and
    a heat spreader lid engaged with the picture frame stiffener such that a central portion of at least one side of the heat spreader lid extends into the opening in the picture frame stiffener and engages the back side of the die.

12. The semiconductor package of claim 11, further comprising an underfill material substantially disposed between the die and the substrate.

13. The semiconductor package of claim 12, further comprising a solder ball grid array attached to the underside of the substrate.

14. The semiconductor package of claim 13, wherein the stiffener is about 0.6 to 1 mm thick.

15. The semiconductor package of claim 12, wherein the heat spreader lid comprises copper.

16. The semiconductor package of claim 11, wherein the perimeter of the heat spreader lid is bonded to the stiffener and the extended central portion of the heat spreader lid is connected with the back side of the die.

17. The semiconductor package of claim 16, wherein the heat spreader lid is connected with the back side of the die via a thermal grease.

18. The semiconductor package of claim 17, wherein the central portion of the heat spreader lid extends from about 1 to 5 mm into the opening in the stiffener.

19. The semiconductor package of claim 16, wherein the heat spreader lid is connected with the back side of the die via a thermal adhesive.

20. The semiconductor package of claim 19, wherein the central portion of the heat spreader lid extends about 3 mm into the opening in the stiffener.

21. The semiconductor package of claim 16, wherein the stiffener is about 0.8 mm thick.

22. The semiconductor package of claim 11 wherein the stiffener comprises copper.

23. The semiconductor package of claim 11, wherein the heat spreader lid has a perimeter thickness that is less than the central portion thickness.

24. The semiconductor package of claim 23, wherein the side of the heat spreader lid that is opposite the stiffener is substantially planar.

25. The semiconductor package of claim 24, wherein the central portion thickness is about 0.6 to 1 mm and the perimeter thickness is about 0.3 to 0.7 mm.

26. The semiconductor package of claim 23, wherein the central portion thickness is about 0.8 mm and the perimeter thickness is about 0.5 mm.

* * * * *